United States Patent [19]

Tanaka et al.

[11] Patent Number: 4,575,399
[45] Date of Patent: Mar. 11, 1986

[54] METHOD OF PATTERN DETECTION

[75] Inventors: Toshihiko Tanaka, Setagaya; Norio Hasegawa; Tetsuya Hayashida, both of Nishitama, all of Japan

[73] Assignee: Hitachi, Ltd., Tokyo, Japan

[21] Appl. No.: 689,803

[22] Filed: Jan. 8, 1985

[30] Foreign Application Priority Data

Jan. 17, 1984 [JP] Japan .................................. 59-4813

[51] Int. Cl.⁴ .......................... G03C 5/00; B05D 3/06; B32B 31/00
[52] U.S. Cl. .................................. 156/272.8; 156/626; 156/643; 427/35; 427/43.1; 427/53.1; 427/54.1; 430/5; 430/296; 430/945
[58] Field of Search ................ 427/35, 36, 43.1, 53.1, 427/54.1; 430/5, 296, 312, 313, 942, 945, 966, 967; 156/64, 272.8, 626, 643; 250/492.1, 492.2, 492.3; 219/121 EM, 121 LM

[56] References Cited

U.S. PATENT DOCUMENTS 3,922,774 12/1975 Lindmayer et al. ............ 430/312 X
4,178,404 12/1979 Allen et al. ...................... 156/630 X
4,434,224  2/1984 Yoshikawa et al. ......... 156/659.1 X Primary Examiner—William A. Powell
Attorney, Agent, or Firm—Antonelli, Terry & Wands

[57] ABSTRACT

An anti-reflective coating film is formed on a resist film formed on a substrate having a target pattern formed on its surface, thereby to reduce multiple reflection of light in said resist film. The distortion of the pattern detection signal due to multiple reflection in said resist film is thereby prevented to improve the mask positioning accuracy.

10 Claims, 8 Drawing Figures

METHOD OF PATTERN DETECTION

BACKGROUND OF THE INVENTION

This invention relates to a pattern detection method, and more particularly to a target pattern detection method which is especially useful when forming various types of fine patterns such as semiconductor integrated circuit patterns or magnetic bubble element patterns by using lithographic techniques.

For accurately forming a fine pattern at a desired position on the surface of a substrate by lithographic techniques, it is necessary to correctly place a mask having said fine pattern at a specified position above said substrate and irradiate the substrate through said mask with ultraviolet rays, electron rays, X-rays or ion beams (these irradiating rays or beams are generally referred to simply as light (rays) in this specification).

A semiconductor integrated circuit is formed by repeating exposure through each of the masks having different patterns. Therefore, if the mask is placed with even a slight deviation from the specified position, the respective patterns of wiring, electrodes and other elements formed on the substrate shift from the prescribed positions, making it difficult to precisely form a high-density semiconductor integrated circuit or magnetic bubble element.

The mask is set at its proper position by precisely aligning the pattern formed in the mask in with the target pattern previously formed on the substrate. The target pattern in not always directly formed on the substrate; it is often formed on an insulating film, conductive film, polycrystal silicon film or other types of film. In this specification, however, in order to simplify the explanation, said alignment pattern is described as being formed on the substrate.

Generally, monochromatic light is applied to the substrate and said target pattern is detected from the reflected light and aligned with the alignment pattern in the mask. However, monochromatic light applied to the substrate for detecting the target pattern gives rise to multiple interference in the resist film due to the reflection of light at the surface of the resist film formed on the substrate surface, and the reflected light from the target pattern on the substrate is also distorted by the effect of said multiple interference.

The thickness of said resist film can not be made uniform throughout the film but always varies to some extent, and said multiple interference in the resist film varies according to the film thickness, so that both the intensity and the phase of said reflected light vary according to the position on the resist film. This makes it difficult to detect reflected light (detection signal) from the target pattern precisely, and thus this has been one of the most serious impediments to the formation of high-density semiconductor integrated circuits or magnetic bubble memory elements.

SUMMARY OF THE INVENTION

The object of the invention is to solve said problems of the prior art and to provide a pattern detection method which is capable of detecting the target pattern on the substrate precisely and easily.

According to this invention, in order to attain said object, an anti-reflective coating film having an interfering effect on the reflected light is formed on the resist film so as to attenuate the reflected light directed to the substrate surface from the upper side of the resist film to thereby reduce the disturbance of the target pattern detection signal due to said multiple interference in the resist film.

DETAILED DESCRIPTION OF THE PREFERRED EMBODIMENTS

As stated above, the distortion of the detection signal from the target pattern formed on the substrate is caused by multiple interference induced in the resist film by light applied to the substrate to detect the target pattern.

Figure 1:
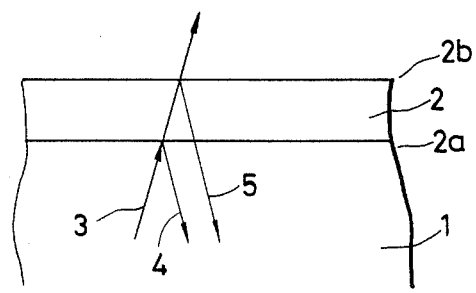
FIG. 1 is a scheme for illustrating the principle of the present invention.

The salient feature of this invention resides in that, as illustrated in FIG. 1, an anti-reflective coating film 2 is superposed on resist film 1 to inhibit multiple interference in said resist film to thereby reduce the possible disturbance of the pattern detection signal.

As shown in FIG. 1, the reflected light 3 from the substrate (not shown) is reflected at the interface 2a between resist film 1 and anti-reflective coating film 2 (if no anti-reflective coating film exists, the interface between resist film 1 and air). The reflected light 4 from said interface 2a is again applied to the substrate and reflected at its surface, and thus if no said anti-reflective coating film 2 exists, such reflections at the interface 2a and at the substrate surface take place repeatedly to distort the detection signal.

When an anti-reflective coating film 2 exists on resist film 1, however, part of said reflected light enters said anti-reflective coating film and part of the light entering said coating film 2 is reflected at the interface 2b between said anti-reflective coating film 2 and outer air, the reflected light 5 again entering resist film 1 after passing through said anti-reflective coating film 2 as shown in FIG. 1.

Reflected light 4 from interface 2a and reflected light 5 from interface 2b interfere with each other, and as a result, the composite intensity of both reflective lights 4, 5 becomes far lower than the intensity of the reflected light 4 if no anti-reflective coating film 2 exists, resulting in a marked decrease of distortion of the detection signal.

Figure 2:
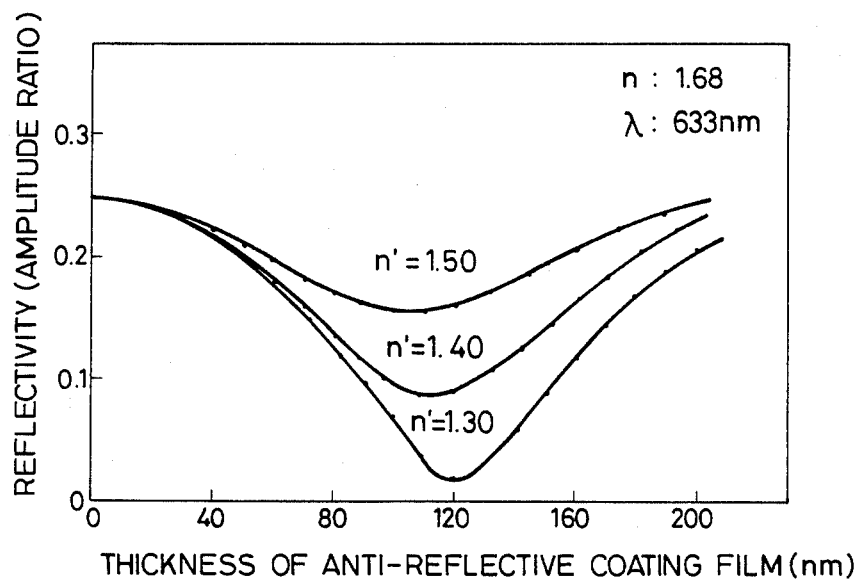
FIG. 2 is a graph showing the relation between the thickness of anti-reflective coating film and its reflectivity as determined by using the anti-reflective coating films differing in refractive index.

FIG. 2 shows graphically the relation between the thickness of anti-reflective coating film and its reflectivity when the wavelength of the light applied for detecting the target pattern is 633 nm, the refractive index of resist film to said light is 1.68, and the refractory n′ of said anti-reflective coating film to said light is 1.30, 1.40 and 1.50.

Assuming that the wavelength of the applied light is λ and the refractive index of resist film to said light is n, it was found that the closer the refractive index n′ of anti-reflective coating film to $\sqrt{n}$ or the closer the thickness of anti-reflective coating film to an odd integer multiple of λ/4n′, the lower the reflectivity and hence the greater effect for the prevention of disturbance of the detection signal is obtained.

Said anti-reflective coating film is preferably made of a material with low light absorptivity so as to allow unobstructed penetration of the light used for the detection of target pattern.

Also, although the foregoing description concerns the case where the anti-reflective coating film is made of a single layer, it will be understood that a similar effect is provided in case the anti-reflective coating film consists of two or more film layers.

EXAMPLE 1

Figure 3A:
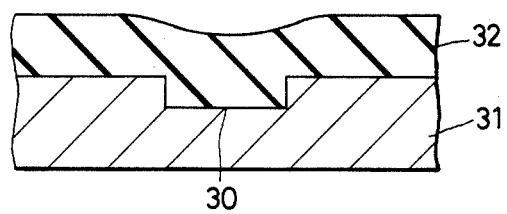
FIGS. 3a and 3b and FIGS. 4a–4d are flow sheets illustrating the different embodiments of the present invention.

As illustrated in FIG. 3a, a Si substrate 31 having a concave target pattern 30 formed on its surface was coated with a photoresist film 31 over its entire surface.

In this Example, AZ1350J (trade name, by Shipley) was used as said photoresist, but it is also possible to use other commercial photoresists such as OFPR800 (trade name, by Tokyo Ohka), X-ray resists such as PMMA (polymethyl methacrylate), PBS (polybutene sulfone), CMS (chloromethylized polystyrene), etc., and electron-ray or ion-beam resists such as PGMA (polygricidyl methacrylate), CMS, PMMA, PBS, etc.

As the target pattern, there can be used not only said concave pattern but also various other patterns such as convex patterns, lattice patterns, Fresnel Zone patterns, etc.

Figure 3B:
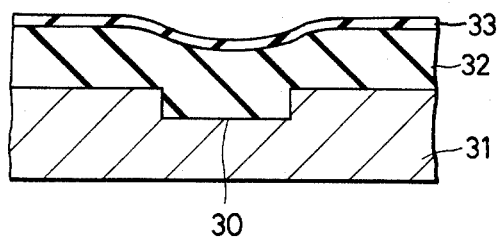

Then, the surface of said resist film 32 was coated with dimethyl polysiloxane to a thickness of approximately 90 to 140 nm to form an anti-reflective coating film 33 as illustrated in FIG. 3b.

An He-Ne laser ($\lambda$: 633 nm) was applied to the laminate and the reflected light from the substrate 31 was detected for detecting the target pattern 30.

As a result, the reflected light from the resist film surface directed toward the substrate decreased and accordingly the disturbance of detection pattern due to multiple interference in the resist film could be effectively prevented to allow precise alignment.

In this Example, an He-Ne laser was used as the target pattern detecting light, but it is possible to use a laser with different wavelengths such as an He-Cd laser or a bright line spectrum such as the e-line or g-line of an Hg lamp. Also, in the method of this invention, pattern detection can be accomplished by using not only monochromatic light but also polychromatic light by forming, in the latter case, the anti-reflective coating films for the respective spectra on the resist film. Further, said anti-reflective coating film may be formed not only with dimethyl polysiloxane mentioned above but also by using other suitable materials which do not cause any change of quality of the underlying resist film and meet said requirements for refractive index, such as various kinds of polysiloxane, polymethylvinylether, polyethylvinylether polyvinyl alcohol, polyethylene glycol, $SiO_2$, hexamethyldisilazane, alginic acid salts such as alginic acid sodium salt, alginic acid tetramethylammonium hydroxide salt, alginic acid tetraethylammonium hydroxide salt and the like.

EXAMPLE 2

Target pattern detection was conducted in the same way as Example 1 except that CMS was used for forming photoresist film 32, polymethylvinylether was used for forming anti-reflective coating film 33, and an intermediate film made of polyvinyl alcohol was interposed therebetween.

In this Example, owing to the presence of said intermediate film between resist film and anti-reflective coating film, target pattern detection could be accomplished with high precision without causing any change of quality of the CMS resist film, and by conducting ordinary exposure and development, a very excellent resist pattern could be formed with high accuracy of alignment.

As the material of said intermediate film, there can be used, beside said polyvinyl alcohol, many other similar materials which have no possiblity of changing the quality of the anti-reflective coating film and resist film. Needless to say, various materials such as mentioned in Example 1 can be used for forming the resist film and anti-reflective coating film.

EXAMPLE 3

Figure 4A:
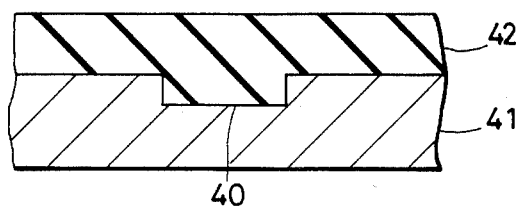
Figure 4B:
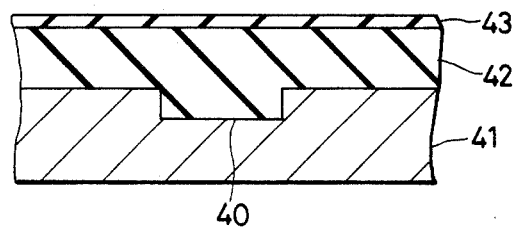

As illustrated in FIG. 4a, a Si substrate 41 having a concave target pattern 40 was coated over its entire surface with AZ1350J to form an organic film 42, and then the whole surface of said organic film 42 was coated with OCDSi 59000 (trade name, by Tokyo Ohka K.K.) to form an intermediate inorganic film 43 as shown in FIG. 4b.

Figure 4C:
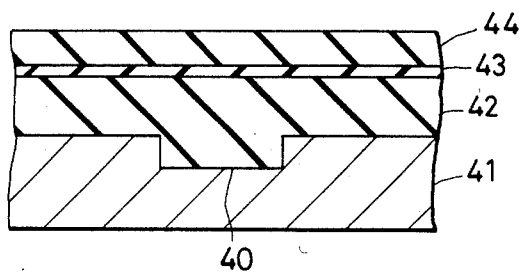
Figure 4D:
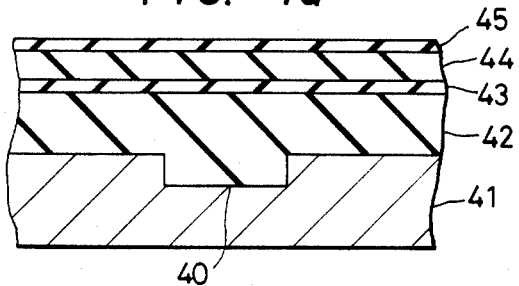

Then the whole surface of said inorganic film 43 was coated with AZ1350J to form a resist film 44 as shown in FIG. 4c, and further this resist film 44 was coated with dimethyl polysiloxane to a thickness of about 100–120 nm to form an anti-reflective coating film 45 as shown in FIG. 4d.

Detection of the target pattern was conducted by using He-Ne laser in the same way as Example 1 to obtain good results.

This Example is an application of the present invention to a so-called multi-layer resist method with which it is possible to form an excellent fine pattern even if a sharp step exists on the substrate surface. It was noted that the desired detection of target could be achieved with very precisely even by said multi-layer resist method owing to the presence of an anti-reflective coating film on the resist film. Use of this multi-layer resist method enables formation of an anti-reflective coating film with an extremely uniform depth because the resist surface can be flattened to a very high extent. Also, the combination of this invention with said multi-layer resist method makes it possible to detect the target very precisely because of the increased anti-reflection efficiency.

In this Example, the known films used in the conventional multi-layer resist method can be employed as said organic film 42, intermediate inorganic film 43 and resist film 44 thereabove.

For example, the organic film 42 can be formed by using, beside said AZ1350J, various known resist films such as HIP 206 (trade name, by Hunt Chemical) and various types of high polymeric organic resins such as PIQ (registered trade name, by Hitachi Kasei Kogyo), polyimide resins, and polysulfone resins. The intermediate inorganic film 43 can be formed with various known materials such as polycrystalline silicon, PSG, $SiO_2$, Si, $N_4$, silica, titanium oxides and various metals such as Mo. The resist film 44 and anti-reflective coating film 45 can be formed by using the materials exemplified in Example 1.

In this embodiment of the invention, an organic film, an intermediate inorganic film and a resist film are used, but the intermediate inorganic film may be excluded if said resist film is formed with a film having high dry etch resistance. It will be obvious that the invention is effective in this case, too.

As described above, it is possible according to this invention to attenuate reflected light from the upper side of the resist film, directed toward the surface of the substrate, in the resist film by a simple means, that is, the provision of an anti-reflective coating film on the resist film, thus realizing an effective prevention of disturbance of the target pattern detection signal which is otherwise caused by multiple interference in the resist film.

This makes it possible to accomplish mask postioning with extremely high accuracy and contributes greatly to the formation of semiconductor integrated circuits with high integration density.

The present invention, as described above, is very effective for the detection of target patterns, but since the principle of this invention resides in preventing distortion of the pattern by reducing multiple reflection in the resist film, the invention is not only appliable to the detection of targets but is also useful for forming various kinds of patterns such as wiring patterns.

What is claimed is:

1. A method of pattern detection comprising the steps of forming a resist film on a substrate having a target pattern formed on its surface; forming on said resist film an anti-reflective coating film for reducing multiple reflection in said resist film; and applying light for detecting said pattern to the surface of said substrate and detecting the reflected light.

2. The method according to claim 1, wherein when the wavelength of said light is given as $\lambda$ and the refractive index of said resist film to said light is given as n, then the refractive index n' of said anti-reflective coating film to said light is substantially equal to $\sqrt{n}$ and the thickness of said anti-reflective coating film is approximately an odd multiple of $\lambda/4n'$.

3. The method according to claim 1, wherein said anti-reflective coating film is selected from polysiloxane film, polymethylvinylether film, polyethylvinylether film, polyvinyl alcohol film, polyethylene glycol film, $SiO_2$ film, hexamethyldisilazane film, silicon oil film, and alginic acid salt film such as alginic acid sodium salt film, alginic acid tetramethylammonium hydroxide salt film and alginic acid tetraethylammonium hydroxide salt film.

4. The method according to claim 1, wherein said resist film is selected from photoresist film, electron-ray resist film, X-ray resist film and ion-beam resist film.

5. The method according to claim 1, wherein said light is laser light or bright line spectrum of mercury.

6. A method of pattern detection comprising the steps of laminating an organic film, an inorganic film, a resist film and an anti-reflective coating film for reducing multiple reflection in said resist film on the surface of a substrate having a target pattern formed on its surface; and applying light for detecting said pattern to the surface of said substrate and detecting the reflected light.

7. The method according to claim 6, wherein when the wavelength of said light is given as $\lambda$ and the refractive index of said resist film is given as n, then the refractive index n' of said anti-reflective coating film to said light is substantially equal to $\cdot n$ and the depth of said anti-reflective coating film is approximately an odd integer multiple of $\lambda/4n'$.

8. The method according to claim 6, wherein said anti-reflective coating film is selected from polysiloxane film, polymethylvinylether film, polyethylvinylether film, polyvinyl alcohol film, polyethylene glycol film, $SO_2$ film, hexamethyldisilazane film, silicon oil film, and alginic acid salt film such as alginic acid sodium salt film, alginic acid tetramethylammonium hydroxide salt film and alginic acid tetraethylammonium hydroxide salt film.

9. The method according to claim 6, wherein said resist film is selected from photoresist film, electron-ray resist film, X-ray resist film and ion-beam resist film.

10. The method according to claim 6, wherein said light is laser light or bright line spectrum of mercury.

* * * * *